(12) United States Patent
Kim et al.

(10) Patent No.: US 7,902,059 B2
(45) Date of Patent: *Mar. 8, 2011

(54) METHODS OF FORMING VOID-FREE LAYERS IN OPENINGS OF SEMICONDUCTOR SUBSTRATES

(75) Inventors: Jung-Hwan Kim, Gyeonggi-do (KR); Hun-Hyeoung Leam, Gyeonggi-do (KR); Jai-Dong Lee, Gyeonggi-do (KR); Young-Seok Kim, Seoul (KR); Young-Sub You, Gyeonggi-do (KR); Ki-Su Na, Gyeonggi-do (KR); Woong Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/608,579

(22) Filed: Oct. 29, 2009

(65) Prior Publication Data

US 2010/0048015 A1 Feb. 25, 2010

Related U.S. Application Data

(63) Continuation of application No. 11/107,529, filed on Apr. 15, 2005, now Pat. No. 7,629,217.

(30) Foreign Application Priority Data

Jun. 15, 2004 (KR) .............................. 2004-0043937

(51) Int. Cl.
*H01L 21/3205* (2006.01)
*H01L 21/4763* (2006.01)

(52) U.S. Cl. ......... 438/593; 438/253; 438/424; 257/506; 257/510

(58) Field of Classification Search .................. 438/253, 438/257, 424, 435, 488, 593; 257/506, 510
See application file for complete search history.

(56) References Cited

U.S. PATENT DOCUMENTS

| 4,639,288 | A  | * | 1/1987  | Price et al. ..................... 438/430 |
| 5,654,234 | A  |   | 8/1997  | Shih et al. |
| 5,903,035 | A  | * | 5/1999  | Wu et al. ........................ 257/381 |
| 6,221,754 | B1 | * | 4/2001  | Chiou et al. ................... 438/619 |
| 6,383,867 | B1 | * | 5/2002  | Kim et al. ..................... 438/253 |
| 6,465,293 | B2 |   | 10/2002 | Park et al. |
| 6,551,913 | B1 | * | 4/2003  | Kim et al. ..................... 438/592 |
| 7,033,908 | B2 | * | 4/2006  | Cha et al. ...................... 438/435 |
| 2003/0100178 | A1 | * | 5/2003 | Kamoshima et al. ......... 438/637 |
| 2005/0023634 | A1 | * | 2/2005 | Yoon et al. .................... 257/506 |

FOREIGN PATENT DOCUMENTS

KR 1997-0018360 A 4/1997
KR 2000-0015110 A 3/2000

* cited by examiner

*Primary Examiner* — Phuc T Dang
(74) *Attorney, Agent, or Firm* — Myers Bigel Sibley & Sajovec

(57) ABSTRACT

In a method of manufacturing a floating gate of a non-volatile semiconductor memory, a pattern is formed on a substrate to have an opening that exposes a portion of the substrate. A first preliminary polysilicon layer is formed on the pattern and the exposed portion of the substrate to substantially fill the opening. A first polysilicon layer is formed by partially etching the first preliminary polysilicon layer until a first void formed in the first preliminary polysilicon layer is exposed. A second polysilicon layer is formed on the first polysilicon layer.

23 Claims, 7 Drawing Sheets

US 7,902,059 B2

METHODS OF FORMING VOID-FREE LAYERS IN OPENINGS OF SEMICONDUCTOR SUBSTRATES

REFERENCE TO PRIORITY APPLICATIONS

This application is a continuation of U.S. patent application Ser. No. 11/107,529, filed Apr. 15, 2005, now U.S. Pat. No. 7,629,217, which claims the benefit of Korean Patent Application No. 2004-0043937 filed Jun. 15, 2004, the contents of which are hereby incorporated herein by reference.

FIELD OF THE INVENTION

The present invention relates to methods of manufacturing semiconductor devices. More particularly, the present invention relates to methods of forming layers in openings of semiconductor substrates.

BACKGROUND OF THE INVENTION

Semiconductor memory devices may be divided into volatile semiconductor memory devices, such as a dynamic random access memory (DRAM) devices or static random access memory (SRAM) devices, and non-volatile semiconductor memory devices, such as read only memory (ROM) devices, flash memory devices or electrically erasable and programmable read only memory (EEPROM) devices. In a flash memory device, data may be electrically stored into the flash memory device or read out from the flash memory device using a Fowler-Nordheim tunneling method or a channel hot electron injection method.

A method of manufacturing a non-volatile semiconductor memory device such as the flash memory device is disclosed in U.S. Pat. No. 6,465,293 issued to Park et al. As described in the Park et al. Abstract, the method comprises the steps of forming an oxide film on a semiconductor substrate in which a device separation film is formed and then patterning the oxide film to expose the semiconductor substrate at a portion in which a floating gate will be formed; sequentially forming a tunnel oxide film and a first polysilicon layer on the entire structure, and then flattening the first polysilicon layer until the tunnel oxide film is exposed to form a floating gate; etching the tunnel oxide film and the oxide film in the exposed portion to a given thickness and the forming a dielectric film on the entire structure; sequentially forming a second polysilicon layer, a tungsten silicide layer and a hard mask and then patterning them to form a control gate; and injecting impurity ions into the semiconductor substrate at the both sides of the floating gate to form a junction region.

As the integration density of semiconductor devices continues to increase, an opening defined by an oxide pattern that partially exposes a semiconductor substrate may have a high aspect ratio. When the opening has the high aspect ratio, a polysilicon layer filling up the opening may have a void therein in a process for manufacturing the semiconductor device.

FIG. 1 is an electron microscopic photograph illustrating a void generated in a polysilicon layer in a conventional method for forming a floating gate.

As shown in FIG. 1, a void 12 generated in a polysilicon layer 10 may not be removed in a planarization process for forming the floating gate. Thus, a portion of the floating gate around the void 12 may be oxidized in successive processes, thereby deteriorating electrical characteristics of a semiconductor device including the floating gate.

SUMMARY

Some embodiments of the invention provide methods of forming void-free layers in openings of semiconductor substrates. More specifically, a first layer is formed in an opening in a semiconductor substrate, wherein the first layer includes a void therein that extends at least partially in the opening. As used herein, a "void" means a substantially enclosed empty space in a layer. The first layer is etched in the opening to at least expose the void. A second layer is then formed in the opening on the first layer that has been etched to at least expose the void. In some embodiments, the first and second layers comprise polysilicon. In some embodiments, the first and second layers are of identical composition. In some embodiments, etching the first layer in the opening to at least expose the void comprises etching the first layer in the opening to eliminate the void.

Moreover, in some embodiments, the first layer is formed by forming a first layer in and outside the opening in the semiconductor substrate, wherein the first layer includes the void therein that extends at least partially in the opening. The first layer is then etched to remove the first layer outside the opening, and to at least expose the void.

In other embodiments, the void is a first void, and the second layer also includes a second void therein that extends at least partially in the opening. In some embodiments, the second layer may be etched in the opening to at least expose the second void and a third layer is formed in the opening on the second layer that has been etched to at least expose the second void.

Embodiments of the present invention as described above may be used to manufacture any layer in an opening in a semiconductor substrate. Embodiments that will now be described may be used specifically to form a polysilicon layer in an opening in a semiconductor substrate and may be particularly used in forming self-aligned polysilicon layers for flash memory devices.

More specifically, in some embodiments of the present invention, a pattern is formed on a substrate. The pattern has an opening that exposes a portion of the substrate. A first preliminary polysilicon layer is formed on the pattern and the exposed portion of the substrate to substantially fill up the opening, except for a first void in the first preliminary polysilicon layer. A first polysilicon layer is formed by partially etching the first preliminary polysilicon layer until the first void in the first preliminary polysilicon layer is exposed. The first polysilicon layer may be formed in the opening only. Then, a second polysilicon layer is formed on the first polysilicon layer.

In some embodiments, the first preliminary polysilicon layer may be partially etched by a wet etching process at a temperature of about 70° C. to about 90° C. using an etching solution that includes ammonium hydroxide ($NH_4OH$), hydrogen peroxide ($H_2O_2$) and deionized water ($H_2O$) by a molar ratio of about 3 to about 10:about 1:about 60 to about 200. Moreover, in forming the second polysilicon layer, the second preliminary polysilicon layer may be formed on the first polysilicon layer and on the pattern to substantially fill a recess caused by the exposure of the first void, except for a second void in the second preliminary polysilicon layer. The second preliminary polysilicon layer may be partially etched to expose the second void in the second preliminary polysilicon layer, thereby forming the second polysilicon layer. A third polysilicon layer may be further formed on the second polysilicon layer in some embodiments.

In accordance with yet other embodiments of the present invention, a mask pattern is formed on a substrate to have a first opening that exposes a portion of the substrate. A trench is formed by etching the exposed portion of the substrate using the mask pattern as an etching mask. An insulation pattern is formed to fill the trench and the first opening. The mask pattern is removed to form a second opening that exposes an active region of the substrate defined by the insulation pattern. A preliminary polysilicon layer is formed on the insulation pattern and on the active region to substantially fill the second opening, except for a void in the preliminary polysilicon layer. A first polysilicon layer is formed by partially etching the preliminary polysilicon layer until the void in the preliminary polysilicon layer is exposed. A second polysilicon layer is formed on the first polysilicon layer. A floating gate is formed in the second opening by partially removing the second polysilicon layer until the insulation pattern is exposed. A first dielectric layer may be formed on the active region of the substrate after removing the mask pattern. The first polysilicon layer may be formed in the second opening only, and the second polysilicon layer may be formed on the insulation pattern and on the first polysilicon layer to fill a recess caused by an exposure of the void. A second dielectric layer may be formed on the floating gate, and then a control gate may be formed on the second dielectric layer.

According to some embodiments of the present invention, a floating gate of a nonvolatile semiconductor memory device may be formed on a substrate without formation of voids in the floating gate because at least one preliminary polysilicon layer is employed for forming the floating gate and at least one etching process is carried out to at least partially remove voids in the preliminary polysilicon layer. Therefore, the nonvolatile semiconductor memory device may have improved electrical characteristics and also throughput of a semiconductor memory device manufacturing process may be enhanced.

DESCRIPTION OF THE EMBODIMENTS

Figure 1:
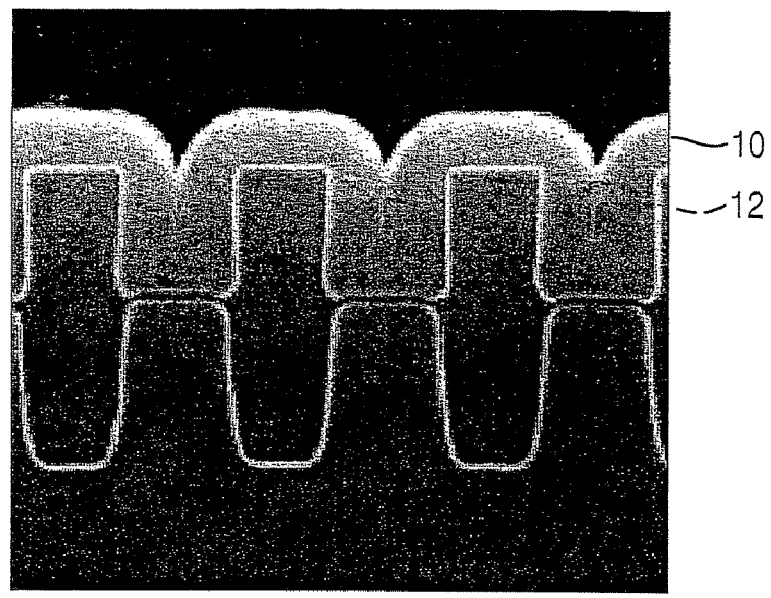
FIG. 1 is an electron microscopic photograph illustrating a void generated in a polysilicon layer in a conventional method for forming a floating gate.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that when an element is referred to as being "on" another element, it can be directly on the other element or intervening elements may be present. In contrast, when an element is referred to as being "directly on" another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first layer could be termed a second layer, and, similarly, a second layer could be termed a first layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

FIGS. 2 to 8, 10 and 11 are cross sectional views illustrating methods of manufacturing semiconductor devices in accordance with exemplary embodiments of the present invention.

Figure 2:
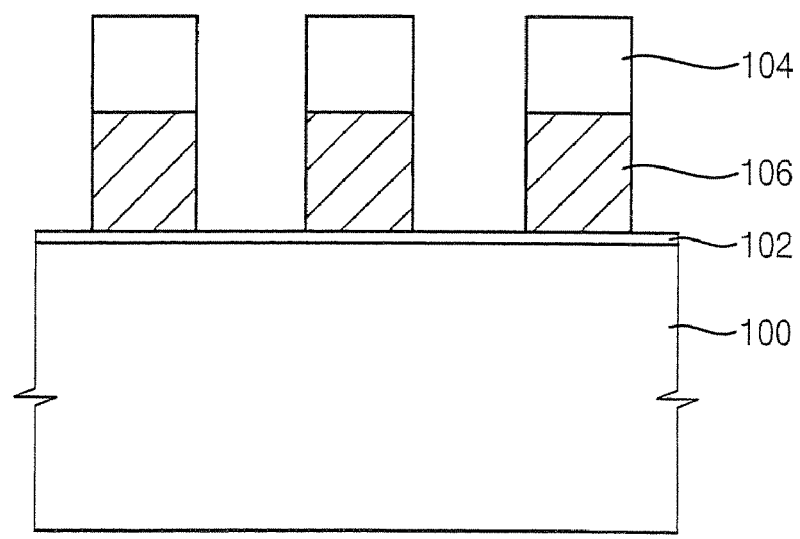
FIGS. 2 to 8, 10 and 11 are cross sectional views illustrating methods of manufacturing semiconductor devices in accordance with exemplary embodiments of the present invention.

FIG. 2 is a cross sectional view illustrating forming mask patterns 106 on a substrate 100.

Referring to FIG. 2, a pad oxide layer 102 is formed on a semiconductor substrate 100. The semiconductor substrate 100 may include a silicon wafer. The pad oxide layer 102 may be formed on the substrate 100 by a thermal oxidation process and/or a chemical vapor deposition (CVD) process.

A mask layer (not shown) is formed on the pad oxide layer 102. The mask layer may include a nitride such as silicon nitride. The mask layer may be formed using a source gas that includes $SiH_2Cl_2$, $SiH_4$ and/or $NH_3$. Additionally, the mask layer may be formed on the pad oxide layer 102 by a low pressure chemical vapor deposition (LPCVD) process and/or a plasma-enhanced chemical vapor deposition (PECVD) process.

After a photoresist film is formed on the mask layer, the photoresist film is exposed and developed to thereby form photoresist patterns 104 on the mask layer. The mask patterns 106 are formed on the pad oxide layer 102 by partially etching the mask layer using the photoresist patterns 104 as an etching mask. Here, the mask layer may be etched by a dry etching process and/or a reactive ion etching process.

After the mask patterns 106 are formed on the pad oxide layer 102, the photoresist patterns 104 are removed from the mask patterns 106 by an ashing process and/or a stripping process.

Figure 3:
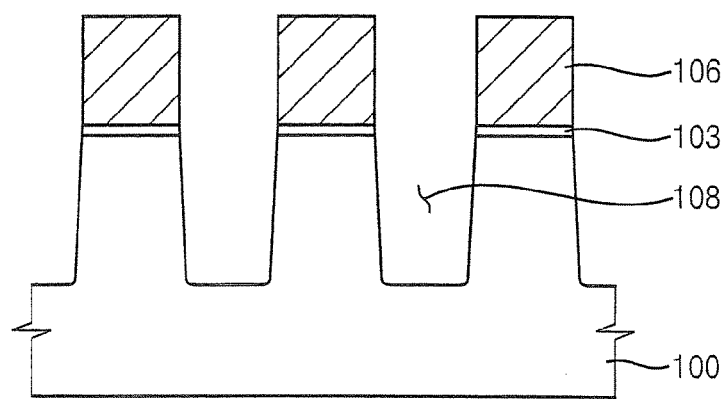

FIG. 3 is a cross sectional view illustrating forming trenches 108 on the substrate 100.

As shown in FIG. 3, the pad oxide layer 102 and the substrate 100 are partially etched using the mask patterns 106 as etching masks to thereby form the trenches 108 on the substrate 100. Here, portions of the pad oxide layer 102 and the substrate 100 between the mask patterns 106 are etched to form the trenches 108. The trenches 108 are formed along a first direction crossing the substrate 100. When the trenches 108 are formed, pad oxide patterns 103 are formed between the mask patterns 106 and the substrate 100. Each of the trenches 108 may have a depth of about 1,000 Å to about 5,000 Å, and in some embodiments, a depth of about 2,300 Å.

Insides of the trenches 108 may be oxidized in order to cure damage to the trenches 108 caused by the etching process of forming the trenches 108. That is, thin oxide layers may be formed on the insides of the trenches 108, respectively. These thin oxide layers may additionally prevent generation of leakage currents from the trenches 108. Each of the thin oxide layers may have a thickness of about 30 Å.

Figure 4:
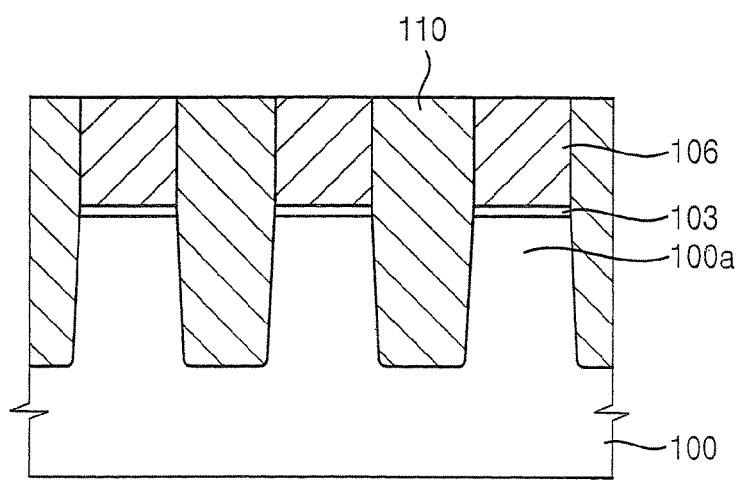

FIG. 4 is a cross sectional view illustrating forming field insulation patterns 110 in the trenches 108.

Referring to FIG. 4, an insulation layer (not shown) is formed on the pad oxide patterns 103 to fill up the trenches 108. The insulation layer may be formed using an oxide such as silicon oxide. Namely, the insulation layer may include undoped silicate glass (USG), $O_3$-terra ethyl ortho silicate (TEOS) and/or high density plasma-chemical vapor deposition (HDP-CVD) oxide. In some embodiments, the insulation layer may include HDP-CVD oxide formed using a gas mixture of $SiH_4$, $O_2$ and/or argon (Ar) as a plasma source.

The insulation layer is partially removed by a chemical mechanical polishing (CMP) process, an etch back process or a combination process of the CMP process and the etch back process until the mask patterns 106 are exposed. As a result, the field insulation patterns 110 are respectively formed in the trenches 108 to define active regions 100a on the substrate 100.

Figure 5:
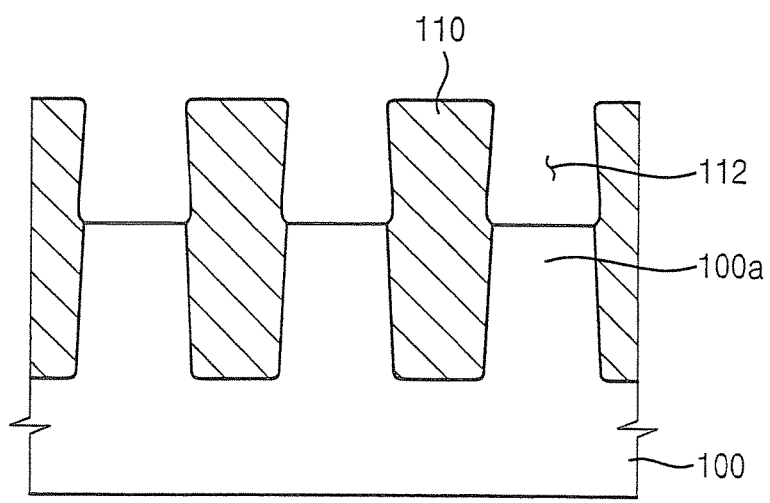

FIG. 5 is a cross sectional view illustrating forming openings 112.

Referring to FIG. 5, the mask patterns 106 and the pad oxide patterns 103 are removed from the substrate 100 to thereby form the openings 112 that expose portions of the substrate 100. The openings 112 defined by the insulation patterns 110 may be formed by a wet etching process and/or a dry etching process. For example, the openings 112 are formed by the wet etching process using an etching solution that includes phosphoric acid. When the openings 112 are formed, lower sidewalls of the insulation patterns 110 may be slightly etched in the etching process of etching the mask patterns 106 and the pad oxide patterns 103.

Accordingly, FIGS. 2 to 5 illustrate forming an opening in a semiconductor substrate, where the semiconductor substrate includes a silicon wafer, and also can include one or more layers thereon. Thus, the opening may be entirely within the layer(s) 110 on the semiconductor substrate 100, as shown in FIG. 5, entirely within the semiconductor substrate 100, or may extend from the layer(s) 110 on the semiconductor substrate 100 into the semiconductor substrate 100 itself.

Figure 6:
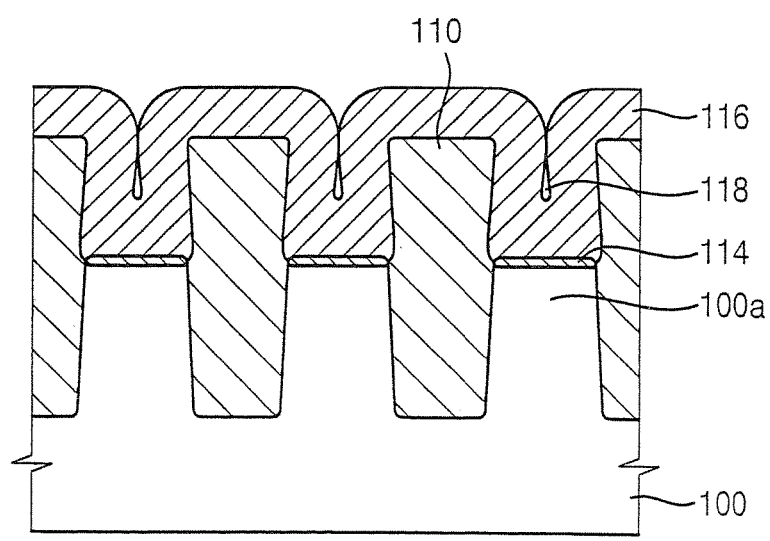

FIG. 6 is a cross sectional view illustrating forming a first preliminary polysilicon layer 116.

Referring to FIG. 6, a first dielectric layer 114 or a tunnel oxide layer is formed on the exposed portions of the substrate 100 through the openings 112. The first dielectric layer 114 may be formed using an oxide such as silicon oxide by a thermal oxidation process and/or a CVD process. Alternatively, the first dielectric layer 114 may include silicon oxide doped with impurities such as fluorine and/or carbon. Furthermore, the first dielectric layer 114 may include a material having a low dielectric constant such as an organic polymer, for example, polyallylether resin, cyclic fluorine resin, siloxane copolymer resin, polyallyletherfluoride resin, polypentafluorostyrene resin, polytetrafluorostyrene resin, polyimidefluoride resin, polynaphthalenefluoride and/or polycide resin, etc. When the first dielectric layer 114 includes the organic polymer, the first dielectric layer 114 may be formed on the exposed portions of the substrate 100 by a plasma enhanced chemical vapor deposition (PECVD) process, an HDP-CVD process, a spin coating process and/or an atmospheric pressure chemical vapor deposition (APCVD) process.

The first preliminary polysilicon layer 116 is formed on the first dielectric layer 114 to completely cover the insulation patterns 110. Accordingly, the openings 112 are substantially covered with the preliminary polysilicon layer 116. The first preliminary polysilicon layer 116 may be formed using an LPCVD process. Impurities are doped into the first preliminary polysilicon layer 116 by an ion implantation process, a diffusion process, an in-situ doping process and/or other process.

When the first preliminary polysilicon layer 116 is formed to fill up the openings 112, deposition irregularities, such as voids 118, are formed in portions of the first preliminary polysilicon layer 116 between the insulation patterns 110. These voids 118 may be more likely formed in the first preliminary polysilicon layer 116 when the openings 112 have increased aspect ratios. That is, as the aspect ratios of the openings 112 increase, the dimensions of the voids 118 may increase and also the formation probability of the voids 118 may grow larger. The voids 118 may degrade electrical characteristics of a floating gate 125 (see FIG. 10) subsequently formed. Alternatively, FIG. 6 illustrates forming a first layer 116 in an opening 112 in the semiconductor substrate 100, the first layer 116 including a void 118 therein that extends at least partially in the opening 112, according to various embodiments of the present invention.

Figure 7:
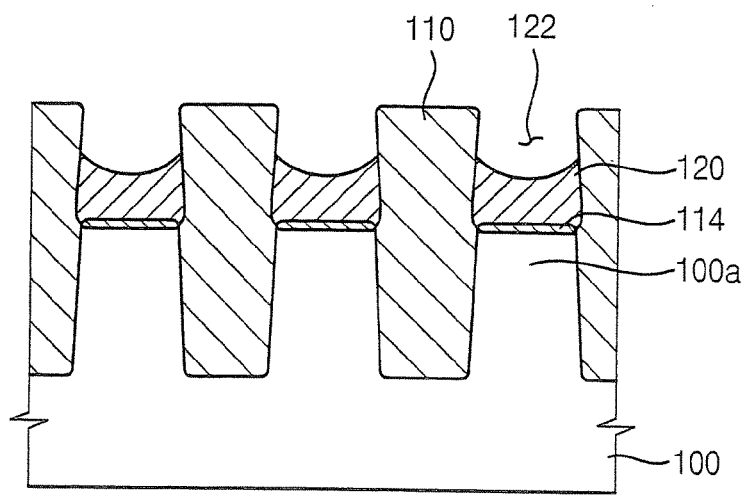

FIG. 7 is a cross sectional view illustrating forming a first preliminary polysilicon layer 120.

Referring to FIG. 7, an upper portion of the first preliminary polysilicon layer 116 is removed until the voids 118 are exposed to thereby form the first polysilicon layer 120 on the first dielectric layer 114. When the first preliminary polysilicon layer 116 is partially removed until the voids 118 are exposed, upper portions of the insulation patterns 110 are simultaneously exposed. Thus, the first preliminary polysilicon layer 116 remains between the insulation patterns 110. Namely, lower portions of the openings 112 are filled with the remaining first preliminary polysilicon layer 116 that corresponds to the first polysilicon layer 120. Since the first polysilicon layer 120 is formed on the first dielectric layer 114 between the insulation patterns 110, the first polysilicon layer 120 is self-aligned relative to the insulation patterns 110. In particular, the first polysilicon layer 120 exists on the first dielectric layer 114 only. An upper face of the first polysilicon layer 120 is substantially lower than faces of the insulation patterns 110. Hence, recesses 122 are formed on the first polysilicon layer 120. The recesses 122 are defined by the sidewalls of the insulation patterns 110 and the upper face of the first polysilicon layer 120. Alternatively, FIG. 7 illustrates etching the first layer 116 in the opening 112 to at least expose the void 118. Etching may take place to only expose the void 118 but not eliminate the void 118, or may proceed to eliminate the void 118, as shown in FIG. 7.

The upper portion of the first preliminary polysilicon layer 116 may be removed by a wet etching process. If the first preliminary polysilicon layer 116 is partially etched by a dry etching using a plasma, the first dielectric layer 114 may be damaged in the etching process. In the wet etching process of partially etching the first preliminary polysilicon layer 116, an etching solution having a high etching selectivity relative to oxide may be used. The etching solution may include ammonium hydroxide ($NH_4OH$), hydrogen peroxide ($H_2O_2$) and/or deionized water ($H_2O$) so that the upper portion of the first preliminary polysilicon layer 116 is advantageously etched without damage to the insulation patterns 110. For example, the etching solution may include a standard cleaning (SC) 1 solution and/or a new standard cleaning (NSC) 1 solution. The NSC 1 solution includes ammonium hydroxide ($NH_4OH$), hydrogen peroxide ($H_2O_2$) and deionized water ($H_2O$) by a molar ratio of about 3 to about 10:about 1:about 60 to about 200. The NSC 1 solution may include ammonium hydroxide, hydrogen peroxide and deionized water by a molar ratio of about 4:about 1:about 95. The wet etching process may be carried out at a temperature of about 70° C. to about 90° C., and in some embodiments, at a temperature of about 80° C.

When the first polysilicon layer 120 is formed by the wet etching process at the temperature of about 80° C. using the NSC 1 solution that includes ammonium hydroxide, hydrogen peroxide and deionized water by a molar ratio of about 4:about 1:about 95, the etching solution has an etching selectivity of about 12.5:about 1 between polysilicon and oxide. Particularly, an etching rate of the first preliminary polysilicon layer 116 is about 31.5 Å/minute, whereas an etching rate of the insulation patterns 110 is about 2.5 Å/minute.

In some embodiments of the present invention, the etching solution has an etching selectivity of about 5.5:about 1 between polysilicon and oxide when the first preliminary polysilicon layer 116 is partially etched by the wet etching process at the temperature of about 70° C. using the SC 1 solution that includes ammonium hydroxide, hydrogen peroxide and deionized water by a molar ratio of about 1:about 4:about 20. That is, an etching rate of the first preliminary polysilicon layer 116 is about 8 Å/minute, whereas an etching rate of the insulation patterns 110 is about 1.4 Å/minute. For example, the wet etching process may be performed for about 10 to about 30 minutes when the first preliminary polysilicon layer 116 has a thickness of about 400 to about 600 Å.

Figure 8:
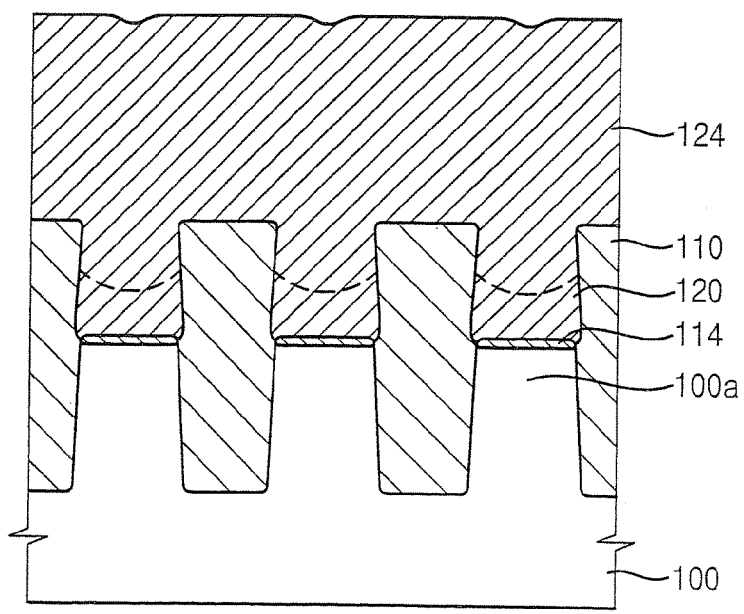
Figure 9:
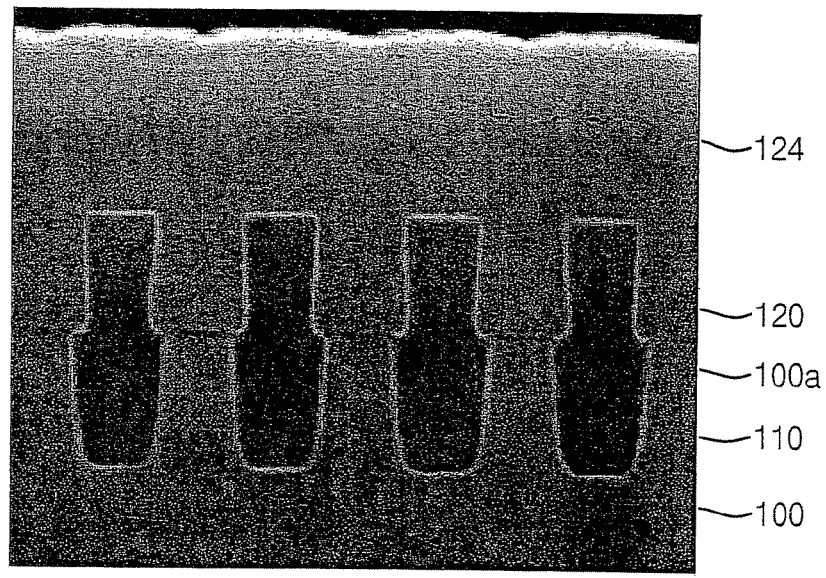
FIG. 9 is an electron microscopic photograph illustrating the first polysilicon layer and the second preliminary polysilicon layer in FIG. 8.

FIG. 8 is a cross sectional view illustrating forming a second preliminary polysilicon layer 124, and FIG. 9 is an electron microscopic photograph illustrating the first polysilicon layer 120 and the second preliminary polysilicon layer 124 in FIG. 5.

Referring to FIGS. 8 and 9, the second preliminary polysilicon layer 124 is formed on the first polysilicon layer 120 and the insulation patterns 110 to fill up the recesses 122. The second preliminary polysilicon layer 124 may be formed by a process substantially identical to that of the first preliminary polysilicon layer 116. That is, the second preliminary polysilicon layer 124 may be formed by an LPCVD process, and impurities may be doped into the second preliminary polysilicon layer 124 by an ion implantation process, a diffusion process, an in-situ doping process and/or other processes.

As described above, the voids 118 in the first preliminary polysilicon layer 116 are removed through the wet etching process in the steps for forming the self-aligned first polysilicon layer 120 and the second preliminary polysilicon layer 124. As a result, the voids 118 are not formed between the first polysilicon layer 120 and the second preliminary polysilicon layer 124 as shown in FIG. 9. Thus, FIGS. 8 and 9 illustrate forming a second layer 124 in the opening on the first layer 120 that has been etched to at least expose the void 118.

Figure 10:
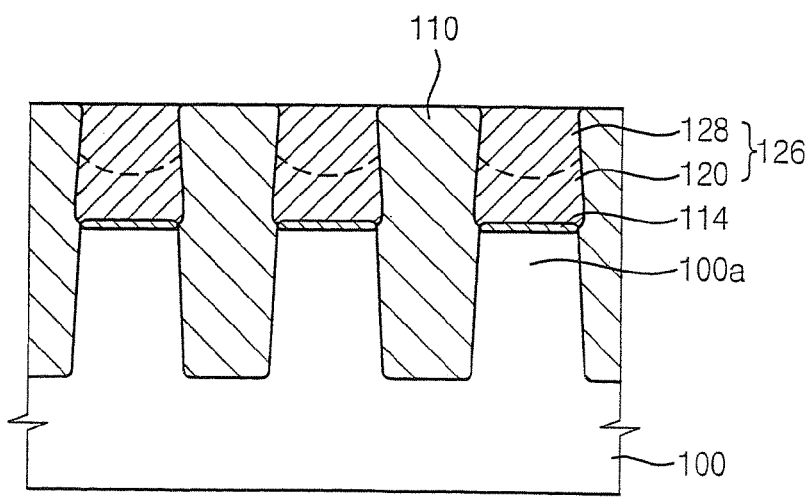

FIG. 10 is a cross sectional view illustrating forming the floating gate 125.

Referring to FIG. 10, an upper portion of the second preliminary polysilicon layer 124 is removed by a planarization process until the insulation patterns 110 are exposed, thereby forming the floating gate 126 that fills the recess 122. The floating gate 126 may be formed by a CMP process, an etch back process or a combination process of the CMP process and the etch back process. When the second preliminary polysilicon layer 124 is partially removed, a second polysilicon layer 128 is formed on the first polysilicon layer 120. The floating gate 126 includes the first polysilicon layer 120 and the second polysilicon layer 128 successively formed on the first dielectric layer 114.

Figure 11:
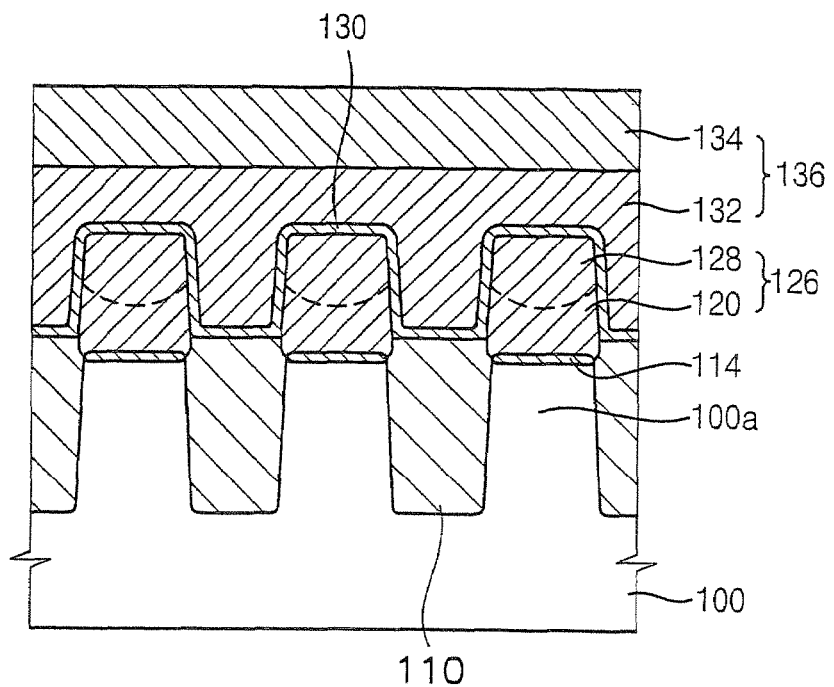

FIG. 11 is a cross sectional view illustrating forming a second dielectric layer 130 and a control gate.

Referring to FIG. 11, upper portions of the insulation patterns 110 are removed to predetermined depths by an etching process such as an isotropic etching process and/or an anisotropic etching process. Upper faces of the etched insulation patterns 110 are substantially higher than that of the first dielectric layer 114 so that the first dielectric layer 114 may not be damaged in the etching process.

The second dielectric layer 130 is formed on the etched insulation patterns 110 and the floating gate 126. The second dielectric layer 130 may be formed using a material that has a high dielectric constant such as yttrium oxide ($Y_2O_3$), hafnium oxide ($HfO_2$), zirconium oxide ($ZrO_2$), niobium oxide ($Nb_2O_5$), barium titanate ($BaTiO_3$), strontium titanate ($SrTiO_3$) and/or other materials. Alternatively, the second dielectric layer 130 may have an ONO structure in which an oxide film, a nitride film and an oxide film are successively formed. The second dielectric layer 130 may be formed using LPCVD process, an atomic layer deposition (ALD) process, a CVD process and/or other process.

A first conductive layer 132 and a second conductive layer 134 are sequentially formed on the second dielectric layer 130 to thereby form the control gate layer 136 on the second dielectric layer 130. The first conductive layer 132 may include polysilicon doped with impurities, and the second conductive layer 134 may include a metal silicide. For example, the second conductive layer 134 may include tungsten silicide ($WSi_x$), titanium silicide ($TiSi_x$), cobalt silicide ($CoSi_x$) and/or tantalum silicide ($TaSi_x$).

The control gate layer 136 is partially etched to form the control gate (not shown) on the second dielectric layer 130. The control gate extends along a second direction substantially perpendicular to the first direction. When the second dielectric layer 130, the floating gate 126 and the first dielectric layer 114 are sequentially patterned, a gate structure of a non-volatile semiconductor memory device is formed on the substrate 100. Source/drain regions (not shown) may then be formed in the active region 100a extending in the first direction by implanting impurities into portions of the active region 100a, thereby completing the non-volatile semiconductor memory devices, such as a flash memory device.

Figure 12:
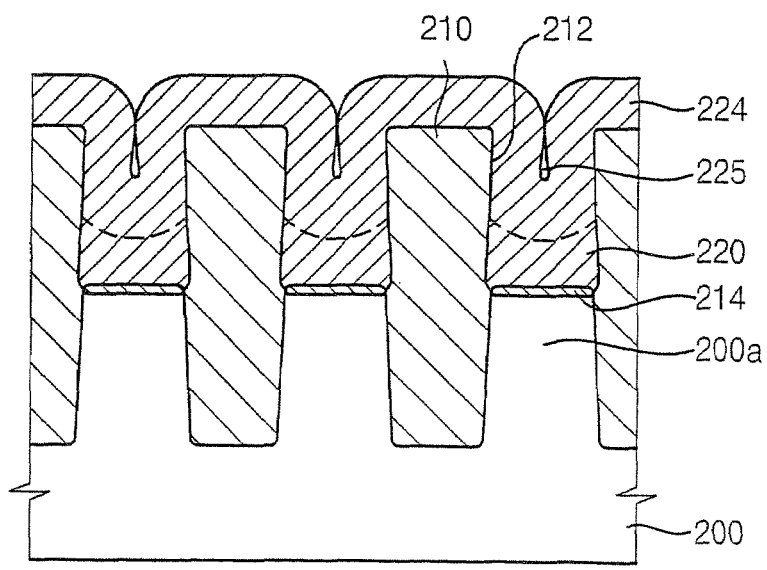
FIGS. 12 to 14 are cross sectional views illustrating methods of manufacturing semiconductor devices in accordance with other exemplary embodiments of the present invention.
Figure 13:
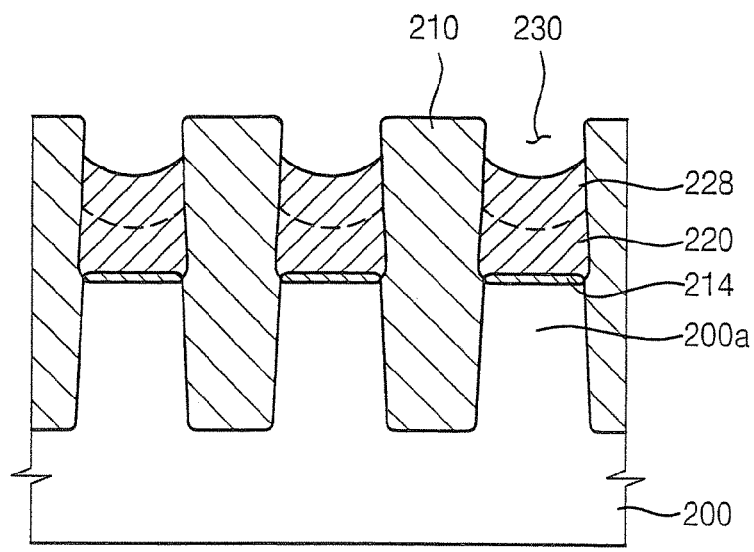
Figure 14:
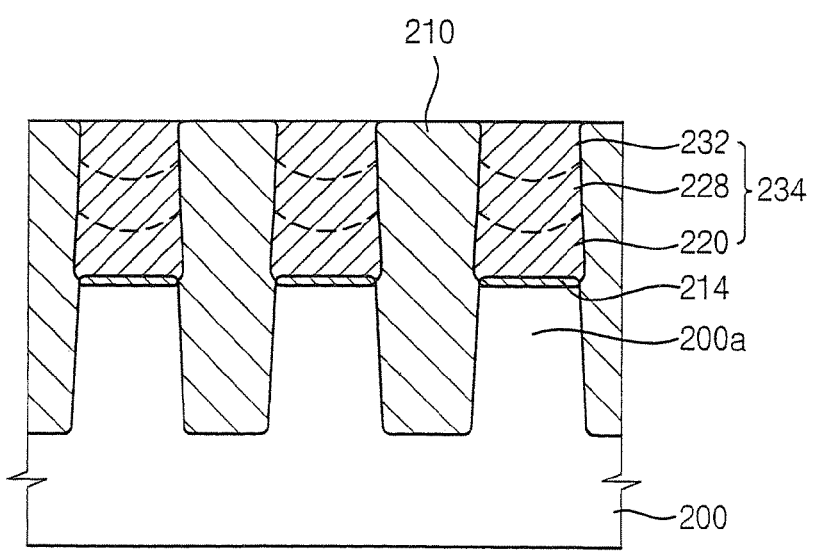

FIGS. 12 to 14 are cross sectional views illustrating methods of manufacturing semiconductor devices in accordance with other exemplary embodiments of the present invention.

FIG. 12 is a cross sectional view illustrating forming a second preliminary polysilicon layer 224.

Referring to FIG. 12, after active regions 200a are defined on a semiconductor substrate 200, insulation patterns 210 are formed on the substrate 200 to expose portions of the active regions 200a. That is, portions of the substrate 200 are exposed by openings 212 formed between the insulation patterns 210. Here, each of the openings 212 may have an aspect ratio substantially higher than that of the opening 112 shown in FIG. 5.

A first dielectric layer 214 is formed on the exposed portions of the substrate 200. A first preliminary polysilicon layer (not shown) including first voids therein is formed on the first dielectric layer 214 and the insulation patterns 210 to fill the openings 212. The first preliminary polysilicon layer is partially removed until the first voids are exposed so that a first polysilicon layer 220 is formed on the first dielectric layer 214. When the first voids are exposed in accordance with formation of the first polysilicon layer 220, first recesses are generated due to the exposed first voids. Each of the first recesses is defined by a sidewall of the insulation pattern 210 and the first polysilicon layer 220 as described above.

The second preliminary polysilicon layer 224 is formed on the first polysilicon layer 220 to substantially cover the insulation patterns 210. The second preliminary polysilicon layer 224 completely fills the first recesses. However, when the second preliminary polysilicon layer 224 is formed, second voids 225 may be formed at portions of the second preliminary polysilicon layer 224 defined by the first recesses. That is, the second voids 225 may be formed at portions of the second preliminary polysilicon layer 224 where the first recesses are positioned because the second preliminary polysilicon layer 224 is formed to fill up the first recesses. Alternatively, FIG. 12 illustrates that the second layer 224 includes a second void 225 therein that extends at least partially in the opening 212.

FIG. 13 is a cross sectional view illustrating forming a second polysilicon layer 228.

Referring to FIG. 13, an upper portion of the second preliminary polysilicon layer 224 is removed by a wet etching process until the second voids 225 are exposed, thereby forming the second polysilicon layer 228 on the first polysilicon layer 220. The second preliminary polysilicon layer 224 may be partially etched using an etching solution including an SC 1 solution and/or an NSC 1 solution. When the second polysilicon layer 228 is formed on the first polysilicon layer 220, second recesses 230 are generated between the insulation patterns 210 due to the second voids 225. Alternatively, FIG. 13 illustrates etching the second layer 224 in the opening 212 to at least expose the second void 225 and, as shown in FIG. 13, to eliminate the second void 225.

FIG. 14 is a cross sectional view illustrating forming a floating gate 234.

Referring to FIG. 14, a third preliminary polysilicon layer (not shown) is formed on the second polysilicon layer 228 and the insulation patterns 210 to fill the second recesses 230. The third preliminary polysilicon layer is partially etched until the insulation patterns 210 are exposed so that a third polysilicon layer 232 is formed on the second polysilicon layer 228. Accordingly, the floating gate 234 including the first to the third polysilicon layers 220, 228 and 232 is formed on the substrate 200. This floating gate 234 may be advantageously employed when the floating gate 234 filling up the opening 212 between the insulation patterns 210 is formed on the active region 200a of the substrate 200. Namely, the floating gate 234 may be formed on the substrate 200 without formation of a void therein although the opening 212 has an increased aspect ratio.

A second dielectric layer (not shown) and a control gate (not shown) are sequentially formed on the floating gate 234 so that a non-volatile semiconductor memory device is formed on the substrate 200.

According to some embodiments of the present invention, a floating gate of a non-volatile semiconductor memory device may be formed on a substrate without formation of voids in the floating gate because at least one preliminary polysilicon layer is employed for forming the floating gate and at least one etching process is carried out to at least partially remove voids in the preliminary polysilicon layer. Therefore, the nonvolatile semiconductor memory device may have improved electrical characteristics and also throughput of a semiconductor memory device manufacturing process may be enhanced. Moreover, embodiments of the invention may be used with semiconductor devices other than non-volatile semiconductor memory devices, and may be used to form void-free layers other than polysilicon.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of manufacturing a semiconductor device comprising:
   forming a pattern on a substrate, the pattern having an opening that exposes a portion of the substrate;
   forming a first preliminary polysilicon layer on the pattern and on the exposed portion of the substrate to substantially fill the opening, a first deposition irregularity in the first preliminary polysilicon layer;
   forming a first polysilicon layer by partially etching the first preliminary polysilicon layer until the first deposition irregularity in the first preliminary polysilicon layer is exposed; and
   forming a second polysilicon layer on the first polysilicon layer and on the pattern to substantially fill a recess caused by an exposure of the first deposition irregularity, a second deposition irregularity in the second preliminary polysilicon layer; and partially etching the second preliminary polysilicon layer to expose the second deposition irregularity in the second preliminary polysilicon layer.

2. The method of claim 1, wherein the first preliminary polysilicon layer is partially etched by a wet etching process.

3. The method of claim 2, wherein the wet etching process is performed using an etching solution that includes ammonium hydroxide ($NH_4OH$), hydrogen peroxide ($H_2O_2$) and deionized water ($H_2O$).

4. The method of claim 3, wherein a molar ratio of ammonium hydroxide, hydrogen peroxide and deionized water is in a range of about 3 to about 10:about 1:about 60 to about 200.

5. The method of claim 4, the molar ratio of ammonium hydroxide, hydrogen peroxide and deionized water is about 4:about 1:about 95.

6. The method of claim 2, wherein the wet etching process is carried out at a temperature of about 70° C. to about 90° C.

7. The method of claim 1, wherein the first polysilicon layer is formed in the opening only.

8. The method of claim 1, further comprising forming a third polysilicon layer on the second polysilicon layer.

9. The method of claim 1, further comprising removing a portion of the second polysilicon layer to expose the pattern.

10. A method of manufacturing a semiconductor device comprising:

forming a mask pattern on a substrate, the mask pattern having a first opening that exposes a portion of the substrate;

forming a trench by etching the exposed portion of the substrate using the mask pattern as an etching mask;

forming an insulation pattern filling the trench and the first opening;

removing the mask pattern to form a second opening that exposes an active region of the substrate defined by the insulation pattern;

forming a preliminary polysilicon layer on the insulation pattern and on the active region to substantially fill the second opening, a deposition irregularity in the preliminary polysilicon layer;

forming a first polysilicon layer by partially etching the preliminary polysilicon layer until the deposition irregularity in the preliminary polysilicon layer is exposed;

forming a second polysilicon layer on the first polysilicon layer; and forming a floating gate in the second opening by partially removing the second polysilicon layer until the insulation pattern is exposed.

11. The method of claim 10, further comprising forming a first dielectric layer on the active region of the substrate after removing the mask pattern.

12. The method of claim 10, wherein the first polysilicon layer is formed by a wet etching process.

13. The method of claim 10, wherein the wet etching process is performed using an etching solution that includes ammonium hydroxide, hydrogen peroxide and deionized water by a molar ratio of about 3 to about 10:about 1:about 60 to about 200.

14. The method of claim 13, wherein the molar ratio of ammonium hydroxide, hydrogen peroxide and deionized water is about 4:about 1:about 95.

15. The method of claim 12, wherein the wet etching process is carried out at a temperature of about 70° C. to about 90° C.

16. The method of claim 10, wherein the first polysilicon layer is formed in the second opening only, and the second polysilicon layer is formed on the insulation pattern and on the first polysilicon layer to substantially fill a recess caused by an exposure of the deposition irregularity.

17. The method of claim 10, further comprising removing an upper portion of the insulation pattern after forming the floating gate.

18. The method of claim 10, further comprising forming a second dielectric layer on the floating gate, and forming a control gate on the second dielectric layer.

19. A method of manufacturing a semiconductor device comprising:

forming a first layer on a bottom and sidewalls of an opening that is on an active region of a semiconductor device substrate, the first layer including a deposition irregularity therein that is enclosed by the first layer and extends at least partially in the opening that is on the active region;

etching the first layer in the opening to at least open the deposition irregularity; and forming a second layer in the deposition irregularity in the opening on the first layer to thereby fill the deposition irregularity and the opening;

wherein the deposition irregularity is a first deposition irregularity and the second layer includes a second deposition irregularity that extends at least partially in the opening, the method further comprising:

etching the second layer in the opening to at least expose the second deposition irregularity; and forming a third layer in the opening on the second layer that has been etched to at least expose the second deposition irregularity.

20. The method of claim 19, wherein the first and second layers comprise polysilicon.

21. The method of claim 19, wherein the first and second layers are of identical composition.

22. The method of claim 19, wherein forming a first layer comprises forming a first layer in and outside the opening in the semiconductor device substrate, the first layer including the deposition irregularity therein that extends at least partially in the opening; and wherein etching the first layer in the opening to at least expose the deposition irregularity comprises etching the first layer to remove the first layer outside the opening and to at least expose the deposition irregularity.

23. The method of claim 19, wherein etching the first layer in the opening to at least expose the deposition irregularity comprises etching the first layer in the opening to eliminate the deposition irregularity.

* * * * *